(12) United States Patent
Jung et al.

(10) Patent No.: US 7,214,581 B2
(45) Date of Patent: May 8, 2007

(54) METHOD OF FABRICATING FLASH MEMORY DEVICE

(75) Inventors: Sung Mun Jung, Kyunggido (KR); Jum Soo Kim, Kyunggido (KR)

(73) Assignee: Dongbu Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 11/019,300

(22) Filed: Dec. 23, 2004

(65) Prior Publication Data
US 2005/0142744 A1 Jun. 30, 2005

(30) Foreign Application Priority Data
Dec. 27, 2003 (KR) ............... 10-2003-0098358

(51) Int. Cl.
*H01L 21/8238* (2006.01)

(52) U.S. Cl. .................... 438/221; 438/257

(58) Field of Classification Search ........ 438/218–219, 438/221, 257, 294, 296
See application file for complete search history.

(56) References Cited

U.S. PATENT DOCUMENTS

| 6,448,606 | B1 * | 9/2002 | Yu et al. ............ 257/315 |
| 6,781,189 | B2 * | 8/2004 | Taylor ............... 257/317 |
| 6,878,588 | B2 * | 4/2005 | Dong et al. ......... 438/257 |

* cited by examiner

*Primary Examiner*—Theresa T. Doan
(74) *Attorney, Agent, or Firm*—Sherr & Nourse, PLLC

(57) ABSTRACT

The present invention provides a method of fabricating a flash memory device, in which floating gates in neighbor cells are separated from each other without using photolithography, which enhances electrical characteristics of the device, and which facilitates a cell size reduction. The present invention includes forming a mask defining a trench forming area on a semiconductor substrate, forming a trench in the semiconductor layer by removing a portion of the semiconductor layer using the mask, forming a device isolation layer filling up the trench to maintain an effective isolation layer thickness exceeding a predefined thickness, removing the mask, forming a conductor layer over the substrate including the device isolation layer, planarizing the conductor layer and the device isolation layer to lie in a same plane, and forming an insulating layer over the substrate including the conductor patterns.

5 Claims, 4 Drawing Sheets

METHOD OF FABRICATING FLASH MEMORY DEVICE

This application claims the benefit of the Korean Application No. P2003-0098358 filed on Dec. 27, 2003, which is hereby incorporated by reference.

BACKGROUND OF THE INVENTION

1. Field of the Invention

The present invention relates to a method of fabricating a flash memory device, in which floating gates in neighbor cells are separated from each other without using photolithography.

2. Discussion of the Related Art

Generally, in forming floating gates for fabricating a flash memory device, it is important to electrically separate the floating gates in neighbor cells.

A method of forming a floating gate according to a related art is explained with reference to FIGS. 1 to 3, as follows. FIG. 1 shows a step of forming a device isolation layer 8 in a semiconductor substrate 2 by STI (shallow trench isolation).

Referring to FIG. 1, a pad oxide layer 4 and a nitride layer 6 are sequentially formed on a semiconductor substrate 2.

A photoresist pattern (not shown in the drawing) exposing an area for forming a trench therein is formed on the nitride layer 6.

The nitride layer and the oxide layer are sequentially etched to expose the semiconductor substrate 2 where a trench will be formed using the photoresist pattern as an etch mask.

After removing the photoresist pattern, the exposed semiconductor substrate 2 is anisotropically etched to form a trench using the patterned nitride layer 6 as an etch mask.

An oxide layer having a prescribed thickness is formed over the substrate 2 including the trench by chemical vapor deposition (hereinafter abbreviated CVD) to fill the trench with an insulator material.

Subsequently, chemical mechanical polishing (hereinafter abbreviated CMP) is carried out on the oxide layer to complete a device isolation layer 8.

Referring to FIG. 2, after the patterned nitride layer has been removed, a tunnel oxide layer 10 is formed over the substrate.

And, a floating gate conductor layer 12 is formed by depositing a doped polysilicon layer on the tunnel oxide layer 10.

A photoresist pattern 14 for patterning a floating gate is then formed on the conductor layer 12.

Referring to FIG. 3, the floating gate conductor layer 12 is anisotropically etched to form a floating gate using the photoresist pattern as an etch mask.

However, in the related art floating gate forming method, it is difficult to pattern the floating gate due to the misalignment, as shown in FIG. 3, between the device isolation layer 8 and the etch mask for patterning the floating gate, i.e., the photoresist pattern 14 in FIG. 2. Hence, limitation is put on reducing a cell size.

SUMMARY OF THE INVENTION

Accordingly, the present invention is directed to a method of fabricating a flash memory device that substantially obviates one or more problems due to limitations and disadvantages of the related art.

An object of the present invention is to provide a method of fabricating a flash memory device, in which floating gates in neighbor cells are separated from each other without using photolithography, by which electrical characteristics of the device is enhanced, and by which a cell size reduction is facilitated.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a flash memory device according to the present invention includes the steps of forming a mask defining a trench forming area on a semiconductor substrate, forming a trench in the semiconductor layer by removing a portion of the semiconductor layer using the mask, forming a device isolation layer filling up the trench to maintain an effective isolation layer thickness exceeding a predefined thickness, removing the mask, forming a conductor layer over the substrate including the device isolation layer, planarizing the conductor layer and the device isolation layer to lie in a same plane, and forming an insulating layer over the substrate including the conductor patterns.

Preferably, the mask is a nitride layer pattern.

Preferably, the nitride layer pattern is formed 1,500~4,500 Å thick.

Preferably, the effective isolation layer thickness is at least 1,000 Å.

Preferably, the planarizing step is carried out by chemical mechanical polishing.

Preferably, the method further includes the step of partially removing the planarized device isolation layer to reduce the effective isolation layer thickness.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 4 to 7 are cross-sectional diagrams for explaining a method of fabricating a flash memory device according to the present invention.

Figure 1:
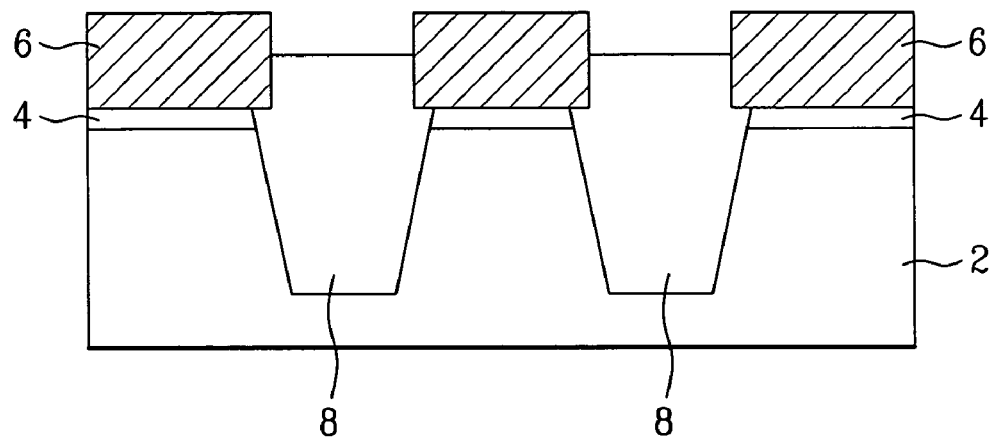
FIGS. 1 to 3 are cross-sectional diagrams for explaining a method of fabricating a flash memory device according to a related art.
Figure 2:
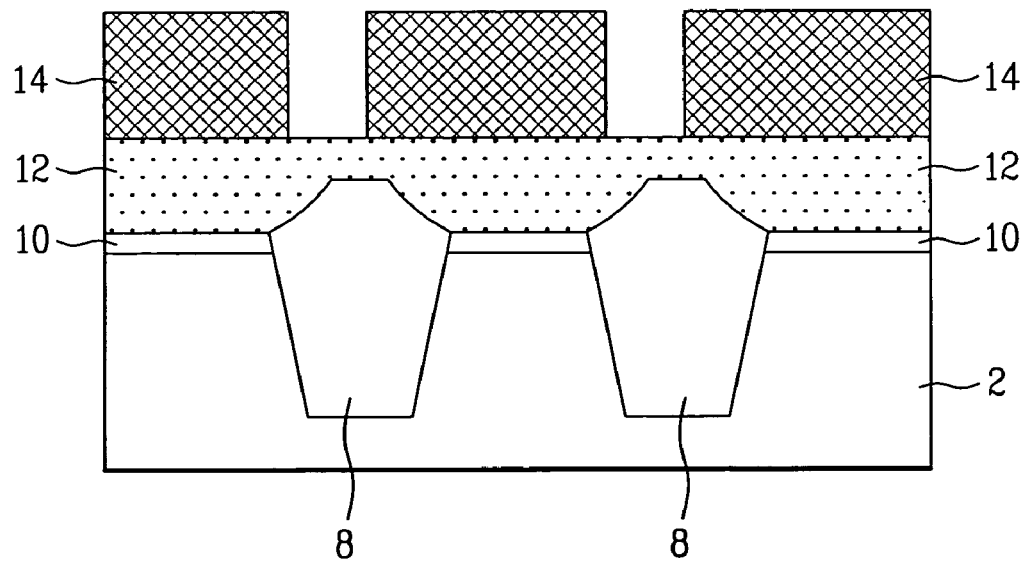
Figure 3:
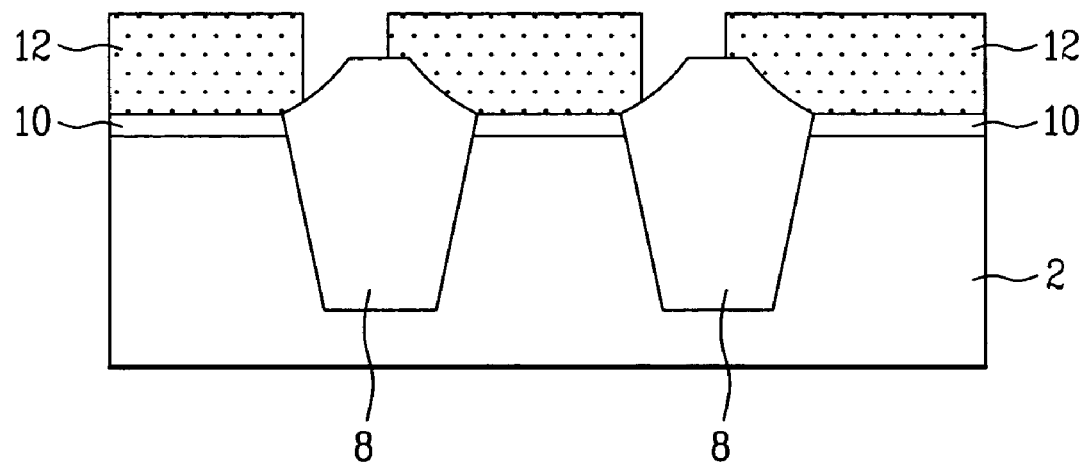
Figure 4:
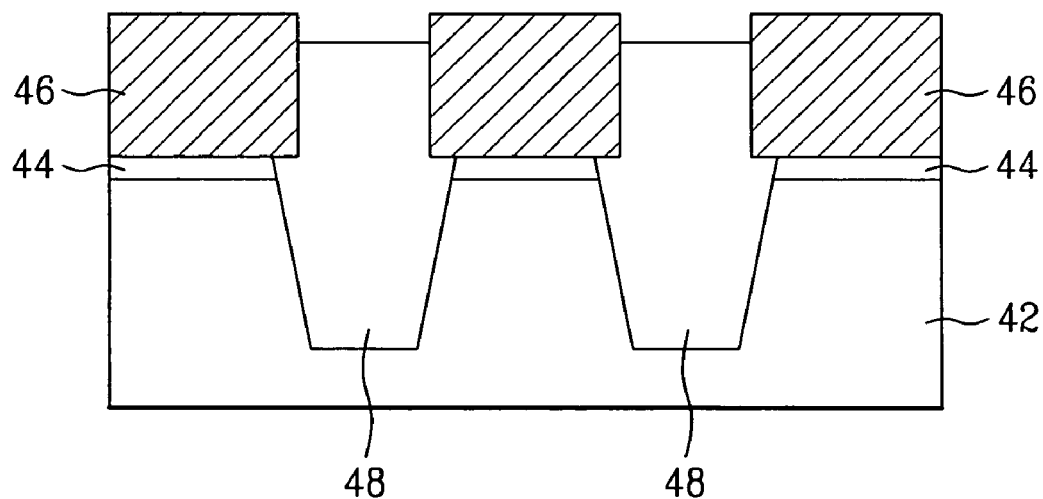
FIGS. 4 to 7 are cross-sectional diagrams for explaining a method of fabricating a flash memory device according to the present invention.

Referring to FIG. 4, a pad oxide layer 44 is formed on a semiconductor substrate 42 by growing an oxide layer 50~150 Å thick. And, a nitride layer 46 is formed on the pad oxide layer 44. In doing so, the nitride layer 46 is formed 1,500~4,500 Å thick.

A photoresist pattern (not shown in the drawing) exposing an area for forming a trench therein is formed on the nitride layer 46.

The nitride layer and the oxide layer are sequentially etched to expose the semiconductor substrate 42 where a trench will be formed using the photoresist pattern as an etch mask.

After removing the photoresist pattern, the exposed semiconductor substrate 2 is anisotropically etched to form a trench using the patterned nitride layer 46 as an etch mask.

An oxide layer, e.g., high density plasma oxide layer, having a prescribed thickness is formed over the substrate 42 including the trench by chemical vapor deposition (hereinafter abbreviated CVD) to fill the trench.

Subsequently, chemical mechanical polishing (hereinafter abbreviated CMP) is carried out on the oxide layer to complete a device isolation layer 48.

Since the nitride layer 46 as the trench forming mask is formed about twice thicker than the related art nitride layer, an effective device isolation layer, i.e., a portion of the device isolation layer 48 protruding out of the semiconductor substrate 42 is thicker than that of the related art device isolation layer. Preferably, the nitride layer and the device isolation layer are adjusted in thickness to form the effective device isolation layer about 1,000 Å thick after removing the nitride layer.

Figure 5:
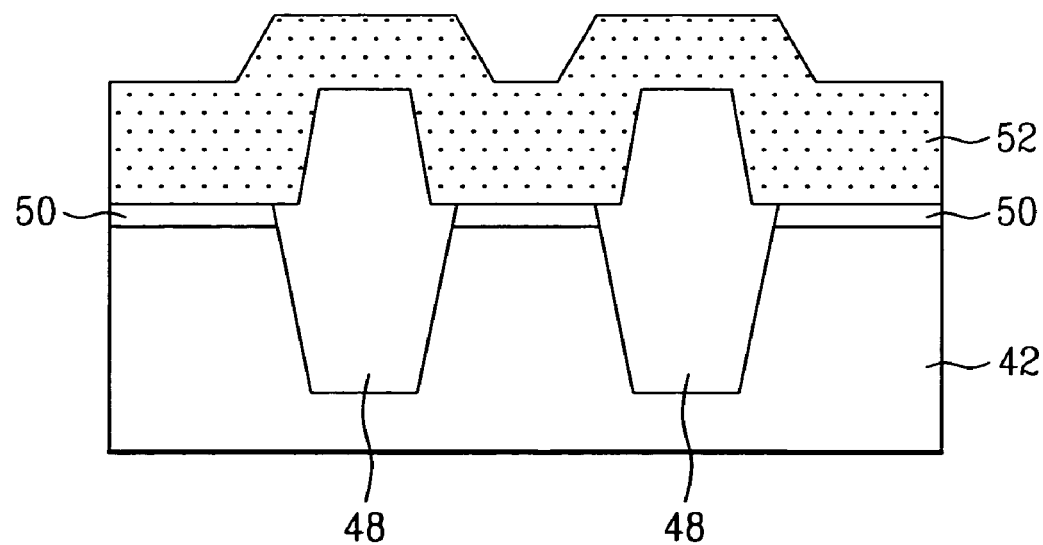

Referring to FIG. 5, the nitride layer is removed by wet etch using a $H_3PO_4$ solution.

And, a tunnel oxide layer 50 is formed over the substrate 42.

A floating gate conductor layer 52 is formed on the tunnel oxide layer 50 by depositing a doped polysilicon layer 52 thereon. Hence, the floating gate conductor layer 52, as shown in the drawing, is formed along topography of the device isolation layer.

Figure 6:
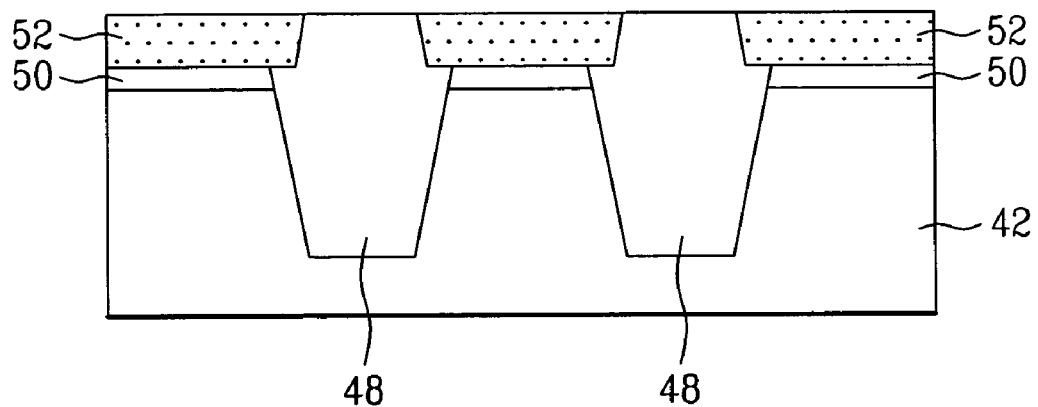

Referring to FIG. 6, CMP is carried out on the floating gate conductor layer 52. In doing so, the CMP is carried out until the device isolation layer 48 is partially removed. Hence, the floating gate conductor layer 52 is separated into a plurality of conductor layer patterns 52 provided to a plurality of cells, respectively.

Thus, the floating gate conductor layer 52 can be divided into many patterns separated from each other for a plurality of the cells, respectively.

Figure 7:
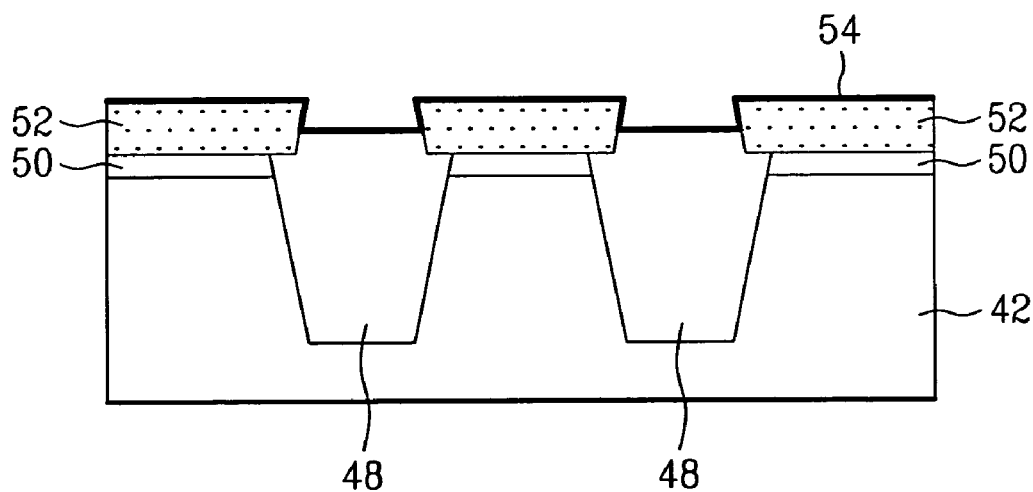

Referring to FIG. 7, a portion of the device isolation layer between the floating gate conductor patterns 52 is removed by wet etch.

An insulating layer 54, e.g., an oxide-nitride-oxide layer is then deposited over the substrate including the floating gate conductor patterns 52.

Thus, once the device isolation layer between the floating gate conductor patterns 52 is removed, it is able to maximize an interface between a floating gate and the insulating layer 54. Hence, a coupling ratio of a cell is increased to raise an operational speed of the device.

Thereafter, the rest of the steps for fabricating the flash memory device are carried out by a general method.

As mentioned in the above description of the present invention, the effective device isolation layer is formed thick, the floating gate conductor layer is formed along the topography of the device isolation layer, and the floating gate patterns are then formed by performing CMP on the floating gate conductor layer.

Accordingly, the floating gate conductor layer can be precisely separated into the floating gate patterns without employing photolithography for the floating gates in the flash memory fabrication.

Therefore, the present invention facilitates the device size reduction and lowers the number of masks.

And, the present invention increases the interface area between the floating gate and the insulating layer, thereby enhancing an operational speed of the device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a flash memory device, comprising the steps of:
   forming a mask defining a trench-forming area on a semiconductor substrate;
   forming a trench in the substrate by removing a portion of the substrate using the mask;
   forming a device isolation layer by filling the trench to maintain an effective isolation layer thickness exceeding a predetermined thickness;
   removing the mask;
   forming a conductor layer over the substrate and the device isolation layer;
   partially removing the conductor layer and the device isolation layer to planarize the conductor layer and the device isolation layer;
   partially removing the planarized device isolation layer to reduce the effective isolation layer thickness; and
   forming an insulating layer over the conductor layer and the partially removed planarized device isolation layer.

2. The method of claim 1, wherein the mask is a nitride layer pattern.

3. The method of claim 2, wherein the nitride layer pattern is formed to have a thickness of about 1,500~4,500 Å.

4. The method of claim 1, wherein the effective isolation layer thickness is at least 1,000 Å.

5. The method of claim 1, wherein planarization of the conductor layer and the device isolation layer is carried out by chemical mechanical polishing.

* * * * *